United States Patent
Gu et al.

(10) Patent No.: US 10,818,841 B2
(45) Date of Patent: Oct. 27, 2020

(54) METHOD OF FABRICATING ORGANIC LIGHT EMITTING DIODE DISPLAY

(71) Applicant: Wuhan China Star Optoelectronics Semiconductor Display Technology Co., Ltd., Wuhan (CN)

(72) Inventors: Yu Gu, Wuhan (CN); Hsianglun Hsu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 58 days.

(21) Appl. No.: 16/347,816

(22) PCT Filed: Nov. 6, 2018

(86) PCT No.: PCT/CN2018/114147
§ 371 (c)(1),
(2) Date: May 7, 2019

(87) PCT Pub. No.: WO2019/242210
PCT Pub. Date: Dec. 26, 2019

(65) Prior Publication Data
US 2020/0161553 A1    May 21, 2020

(30) Foreign Application Priority Data
Jun. 21, 2018 (CN) .......................... 2018 1 0641172

(51) Int. Cl.
*H01L 51/56* (2006.01)
*H01L 51/00* (2006.01)
*H01L 27/32* (2006.01)

(52) U.S. Cl.
CPC ...... *H01L 51/0011* (2013.01); *H01L 27/3246* (2013.01); *H01L 51/56* (2013.01); *H01L 2227/323* (2013.01)

(58) Field of Classification Search
CPC . H01L 51/0011; H01L 27/3246; H01L 51/56; H01L 51/003; H01L 2227/323
See application file for complete search history.

(56) References Cited

U.S. PATENT DOCUMENTS 10,424,627 B2 * 9/2019 Lee .......................... H01L 51/56
2015/0064818 A1 3/2015 Li et al.
(Continued)

FOREIGN PATENT DOCUMENTS

| CN | 103311460 | 9/2013 |
| CN | 103887319 | 6/2014 |

(Continued)

*Primary Examiner* — Thanh T Nguyen

(57) ABSTRACT

The present invention provides a method of fabricating an organic light emitting diode display, including forming an exfoliation layer to be peeled off on the base substrate corresponding to two of the first predetermined area, the second predetermined area, and the third predetermined area; using a predetermined mask to form an organic light emitting layer on the exfoliation layer and the base substrate which is not covered by the exfoliation layer; and heating the base substrate to peel off the exfoliation layer and the organic light emitting layer on the exfoliation layer, while remaining the organic light emitting layer not covered by the exfoliation layer.

18 Claims, 3 Drawing Sheets

(56) References Cited

U.S. PATENT DOCUMENTS

| | | | |
|---|---|---|---|
| 2015/0236308 A1 | 8/2015 | Kim et al. | |
| 2015/0357384 A1* | 12/2015 | Li | H01L 51/5231 |
| | | | 257/40 |
| 2017/0287694 A1* | 10/2017 | Robello | G03F 7/325 |
| 2017/0365812 A1* | 12/2017 | Choung | H01L 27/3276 |
| 2018/0366524 A1* | 12/2018 | Bang | H01L 51/0021 |
| 2019/0019851 A1* | 1/2019 | Chen | H01L 51/5088 |

FOREIGN PATENT DOCUMENTS

| | | |
|---|---|---|
| CN | 103943652 | 7/2014 |
| CN | 107093678 | 8/2017 |
| JP | 09-204984 | 8/1997 |

\* cited by examiner

METHOD OF FABRICATING ORGANIC LIGHT EMITTING DIODE DISPLAY

RELATED APPLICATIONS

This application is a National Phase of PCT Patent Application No. PCT/CN2018/114147 having International filing date of Nov. 6, 2018, which claims the benefit of priority of Chinese Patent Application No. 201810641172.5 filed on Jun. 21, 2018. The contents of the above applications are all incorporated by reference as if fully set forth herein in their entirety.

FIELD AND BACKGROUND OF THE INVENTION

The present invention relates to the field of display technologies, and in particular, to a method of fabricating an organic light emitting diode display.

An organic light emitting diode has advantages of self-illumination, wide operating temperature range, fast response times, wide viewing angles, high luminous efficiency, being able to be fabricated on a flexible substrate, and low driving voltage and energy consumption. Thus, the organic light emitting diode is reputed to be a next-generation display technology.

With the rapid development of display technology, people have put forward higher requirements for the organic light emitting diode display, such as wider color gamut, higher brightness, lower power consumption and higher resolution.

In particular, requirements for the screen resolution are most obvious. In order to obtain a higher screen resolution, it is necessary to use a fine-metal-mask (FMM) to coat by evaporating light emitting materials corresponding to RGB. The cost of production, maintenance, transportation and cleaning of FMM is relatively high. Meanwhile, production capacity of high-resolution FMM is limited.

In order to reduce the shadow of the mask, existing high-resolution FMMs require its thickness to be strictly controlled, which is only several tens of micrometers. To form openings in such a thin metal sheet, after the mask is subjected to a tensioning process, the openings of the mask and the pixel regions of the substrate are difficult to accurately align, causing the display to be prone to color mixing, thereby reducing resolution of the display.

Therefore, it is necessary to provide a method of fabricating an organic light emitting diode display to solve the problems of the prior art.

SUMMARY OF THE INVENTION

An object of the present invention is to provide a method of fabricating an organic light emitting diode display that can improve the resolution of the display.

To solve the above technical problem, the present invention provides a method of fabricating an organic light emitting diode display, including:

forming a pixel definition layer on a base substrate, wherein the pixel definition layer includes a plurality of pixel definition units spaced apart from each other; and a first predetermined area, a second predetermined area, and a third predetermined area are provided among the pixel definition units; and forming a light emitting unit in the first predetermined area, the second predetermined area, and the third predetermined area, including:

forming an exfoliation layer to be peeled off on the base substrate corresponding to two of the first predetermined area, the second predetermined area, and the third predetermined area, a material of the layer to be peeled including sulfur;

using a predetermined mask to form an organic light emitting layer on the exfoliation layer and the base substrate which is not covered by the exfoliation layer; and heating the base substrate to cause sublimation of the material of the exfoliation layer, thereby peeling off the exfoliation layer and the organic light emitting layer attached to the exfoliation layer, while remaining the organic light emitting layer not covered by the exfoliation layer, such that the light emitting unit is obtained, wherein the predetermined mask has an opening greater than a default value.

In the method of fabricating the organic light emitting diode display according to the present invention, the step of forming a exfoliation layer on the base substrate corresponding to two of the first predetermined area, the second predetermined area, and the third predetermined area includes:

coating by evaporating a material to be peeled off on the base substrate corresponding to two of the first predetermined area, the second predetermined area, and the third predetermined area to form the exfoliation layer.

In the method of fabricating the organic light emitting diode display according to the present invention, the light emitting unit includes a first light emitting unit, and the step of forming a light emitting unit in the first predetermined area, the second predetermined area, and the third predetermined area includes:

forming the exfoliation layer on the base substrate corresponding to the second predetermined area and the third predetermined area;

using a first predetermined mask to form a first organic light emitting layer on the exfoliation layer and the base substrate corresponding to the first predetermined area, wherein the first predetermined mask has an opening greater than the default value;

heating the base substrate to peel off the exfoliation layer and the first organic light emitting layer corresponding to the second predetermined area and the third predetermined area, while remain the first organic light emitting layer of the first predetermined area, such that the first light emitting unit is obtained.

In the method of fabricating the organic light emitting diode display according to the present invention, the light emitting unit further includes a second light emitting unit, and the step of forming the light unit in the first predetermined area, the second predetermined area, and the third predetermined area includes:

forming the exfoliation layer on the base substrate corresponding to the first light emitting unit and the third predetermined area;

using a second predetermined mask to coat by evaporating a second organic light emitting material on the exfoliation layer and the base substrate corresponding to the second predetermined area to form a second organic light emitting layer, wherein the second predetermined mask has an opening greater than the default value; and heating the base substrate to peel off the exfoliation layer and the second organic light emitting layer corresponding to the first predetermined area and the third predetermined area during heating, while remain the second organic light emitting layer of the second predetermined area, such that the second light emitting unit is obtained.

In the method of fabricating the organic light emitting diode display according to the present invention, the illuminating unit further includes a third illuminating unit, and the step of forming the illuminating unit in the first predetermined area, the second predetermined area, and the third predetermined area includes:

the light emitting unit further includes a third light emitting unit, and the step of forming the light emitting unit in the first predetermined area, the second predetermined area, and the third predetermined area includes:

forming the exfoliation layer at the first light emitting unit and the second light emitting unit;

using a third predetermined mask to coat by evaporating a third organic light emitting material on the base substrate corresponding to the third predetermined area and the exfoliation layer to form a third organic light emitting layer, wherein the third predetermined mask has an opening greater than the default value; and heating the base substrate to peel off the layer to be peeled and the third organic light emitting layer corresponding to the first predetermined area and the second predetermined area, while remain the third organic light emitting layer of the third predetermined area, such that the third light emitting unit is obtained.

In the method of fabricating the organic light emitting diode display according to the present invention, the first organic light emitting material is used to form the first light emitting unit; the second organic light emitting material is used to form the second light emitting unit; and the third organic light emitting material is used to form the third light emitting unit.

In the method of fabricating the organic light emitting diode display according to the present invention, the step of using the first predetermined mask to form a first organic light emitting layer on the exfoliation layer and the base substrate corresponding to the first predetermined area includes:

using the first predetermined mask to coat by evaporating a first organic light emitting material on the exfoliation layer and the base substrate corresponding to the first predetermined area to form the first organic light emitting layer.

In the method of fabricating the organic light emitting diode display according to the present invention, the base substrate includes a substrate and an anode, and the method further includes: forming a cathode on the light emitting unit.

The present invention provides a method of fabricating an organic light emitting diode display, including:

forming a pixel definition layer on a base substrate, wherein the pixel definition layer includes a plurality of pixel definition units spaced apart from each other, and a first predetermined area, a second predetermined area, and a third predetermined area are provided among the pixel definition units; and forming a light emitting unit in the first predetermined area, the second predetermined area, and the third predetermined area, including:

forming an exfoliation layer to be peeled off on the base substrate corresponding to two of the first predetermined area, the second predetermined area, and the third predetermined area;

using a predetermined mask to form an organic light emitting layer on the exfoliation layer and the base substrate which is not covered by the exfoliation layer; and heating the base substrate to peel off the exfoliation layer and the organic light emitting layer covering the exfoliation layer, such that a light emitting unit is obtained, and the predetermined mask has an opening greater than the default value.

In the method of fabricating the organic light emitting diode display according to the present invention, a material of the exfoliation layer includes sulfur.

In the method of fabricating the organic light emitting diode display according to the present invention, the light emitting unit includes a first light emitting unit, and the step of forming a light emitting unit in the first predetermined area, the second predetermined area, and the third predetermined area includes:

forming the exfoliation layer on the base substrate corresponding to the second predetermined area and the third predetermined area;

using a first predetermined mask to form a first organic light emitting layer on the exfoliation layer and the base substrate corresponding to the first predetermined area, wherein the first predetermined mask has an opening greater than the default value;

heating the base substrate to peel off the exfoliation layer and the first organic light emitting layer corresponding to the second predetermined area and the third predetermined area, while remain the first organic light emitting layer of the first predetermined area, such that the first light emitting unit is obtained.

In the method of fabricating the organic light emitting diode display according to the present invention, the light emitting unit further includes a second light emitting unit, and the step of forming the light unit in the first predetermined area, the second predetermined area, and the third predetermined area includes:

forming the exfoliation layer on the base substrate corresponding to the first light emitting unit and the third predetermined area;

using a second predetermined mask to coat by evaporating a second organic light emitting material on the exfoliation layer and the base substrate corresponding to the second predetermined area to form a second organic light emitting layer, wherein the second predetermined mask has an opening greater than the default value; and heating the base substrate to peel off the exfoliation layer and the second organic light emitting layer corresponding to the first predetermined area and the third predetermined area during heating, while remain the second organic light emitting layer of the second predetermined area, such that the second light emitting unit is obtained.

In the method of fabricating the organic light emitting diode display according to the present invention, the light emitting unit further includes a third light emitting unit, and the step of forming the light emitting unit in the first predetermined area, the second predetermined area, and the third predetermined area includes:

forming the exfoliation layer at the first light emitting unit and the second light emitting unit;

using a third predetermined mask to coat by evaporating a third organic light emitting material on the base substrate corresponding to the third predetermined area and the exfoliation layer to form a third organic light emitting layer, wherein the third predetermined mask has an opening greater than the default value; and heating the base substrate to peel off the exfoliation layer and the third organic light emitting layer corresponding to the first predetermined area and the second predetermined area, while remain the third organic light emitting layer of the third predetermined area, such that the third light emitting unit is obtained.

In the method of fabricating the organic light emitting diode display according to the present invention, the first organic light emitting material is used to form the first light emitting unit; the second organic light emitting material is used to form the second light emitting unit; and the third organic light emitting material is used to form the third light emitting unit.

In the method of fabricating the organic light emitting diode display according to the present invention, the step of using the first predetermined mask to form a first organic light emitting layer on the exfoliation layer and the base substrate corresponding to the first predetermined area include:

using the first predetermined mask to coat by evaporating a first organic light emitting material on the exfoliation layer and the base substrate corresponding to the first predetermined area to form the first organic light emitting layer.

In the method of fabricating the organic light emitting diode display according to the present invention, the base substrate includes a substrate and an anode, and the method further includes: forming a cathode on the light emitting unit.

In the method of fabricating the organic light emitting diode display according to the present invention, the organic light emitting layer is coated by evaporating using a mask having a large opening, thereby preventing the opening of the mask from being inaccurately aligned with the pixel area, so as to improve the resolution of the display.

SPECIFIC EMBODIMENTS OF THE INVENTION

The following description of the various embodiments is provided to illustrate the specific embodiments of the invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the figures which are merely references. The spatially relative terms are intended to encompass different orientations in addition to the orientation as depicted in the figures.

Referring to FIGS. 1 to 14, FIG. 1 is a schematic structural diagram of a first step of a method of fabricating an organic light emitting diode display according to the present invention.

The method of fabricating the organic light emitting diode display according to the present invention includes the following steps:

Step 101. forming a pixel definition layer on a base substrate, wherein the pixel definition layer includes a plurality of pixel definition units spaced apart from each other; and a first predetermined area, a second predetermined area, and a third predetermined area are provided among the pixel definition units.

Figure 1:
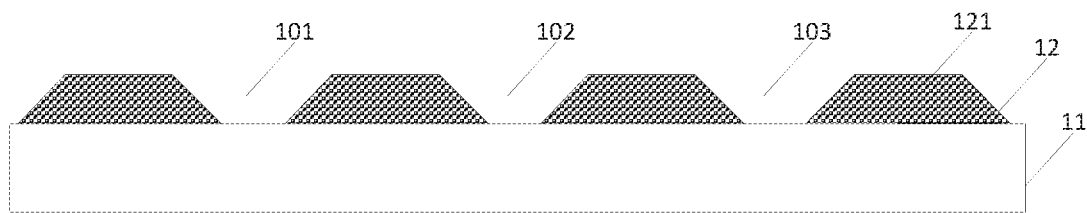
FIG. 1 is a schematic structural diagram of a first step of a method of fabricating an organic light emitting diode display according to the present invention.

As shown in FIG. 1, a pixel defining layer 12 is formed on a base substrate 11, wherein the base substrate 11 includes a substrate and an anode, and the material of the substrate is, for example, glass.

The pixel definition layer 12 includes four pixel definition units 121, and it can be understood that the pixel definition layer 12 includes more than four pixel definition units. A first predetermined area 101, a second predetermined area 102, and a third predetermined area 103 are provided among the pixel definition units 121. The first predetermined area 101, the second predetermined area 102, and the third predetermined areas 103 are respectively disposed between adjacent two of the pixel defining units 121. The first predetermined area 101, the second predetermined area 102, and the third predetermined area 103 are alternately arranged. In an embodiment, the first predetermined area 101 corresponds to the position of the green light emitting unit, the second predetermined area 102 corresponds to the position of the blue light emitting unit, and the third predetermined area 103 corresponds to the position of the red light emitting unit.

As will be appreciated, although only the first predetermined area 101, the second predetermined area 102, and the third predetermined area 103 are shown in FIG. 1, the present invention is not limited thereto. The number of each of the first predetermined area 101, the second predetermined areas 102 and the third predetermined area 103 may be one or more.

Step S102. forming a light emitting unit in the first predetermined area, the second predetermined area, and the third predetermined area, comprising:

Step. S201 forming an exfoliation layer to be peeled off on the base substrate corresponding to two of the first predetermined area.

Figure 2:
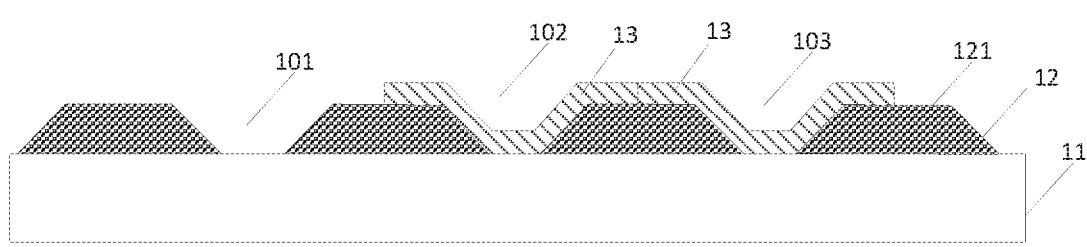
FIG. 2 is a schematic structural diagram of a first substep of the second step of the method of fabricating the organic light emitting diode display according to the present invention.

As shown in FIG. 2, the material to be peeled off is evaporated on the base substrate corresponding to the second predetermined area 102 and the third predetermined area 103 by using a mask to form a layer 13 to be peeled off. The layer 13 to be peeled off is made of materials with sublimation tendency. In an embodiment, the material to be peeled off includes sulfur.

Step. S202 using a predetermined mask to form an organic light emitting layer on the exfoliation layer and the base substrate corresponding to the first predetermined area 101.

Figure 3:
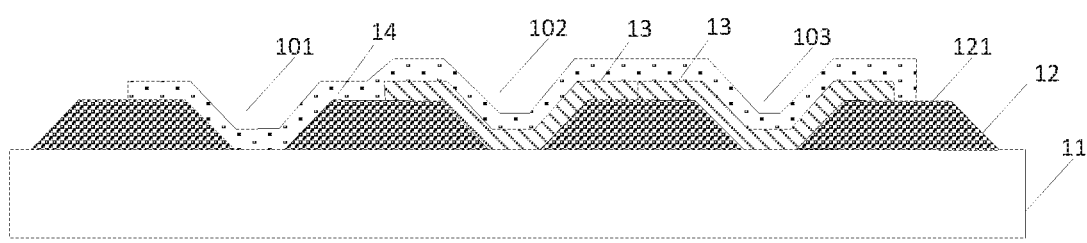
FIG. 3 is a schematic structural diagram of a second substep of the second step of the method of fabricating the organic light emitting diode display according to the present invention.
Figure 5:
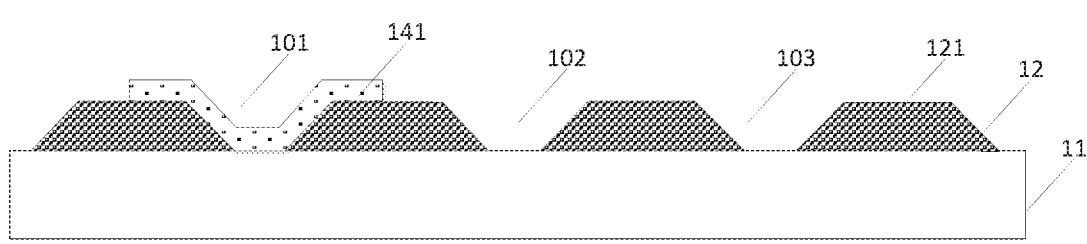
FIG. 5 is a schematic structural diagram after completing the third substep of the second step of the method of fabricating the organic light emitting diode display according to the present invention.

As shown in FIG. 3, a first organic light emitting material is evaporated on the exfoliation layer and the base substrate corresponding to the first predetermined area 101 by using the first predetermined mask to form a first organic light emitting layer 14. The opening of the first predetermined mask (not shown) is greater than a default value. For example, the first predetermined mask is a common mask of a large opening, which is distinguished over the FMM of the prior art. Referring to FIG. 5, the first organic light emitting material is used to form the first light emitting unit 141.

Step S203. heating the base substrate to peel off the exfoliation layer and the second organic light emitting layer corresponding to the first predetermined area and the third predetermined area during heating, while remain the second organic light emitting layer of the second predetermined area, such that the second light emitting unit is obtained.

Figure 4:
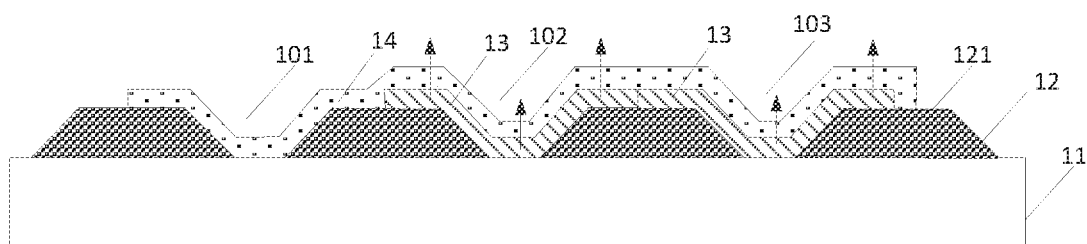
FIG. 4 is a schematic structural diagram of a third substep of the second step of the method of fabricating the organic light emitting diode display according to the present invention.

As shown in FIG. 4, the base substrate is heated to cause sublimation of the material of the layer 13 to be peeled off, thereby peeling off the layer 13 to be peeled off and the organic light emitting layer attached to the exfoliation layer, while remaining the organic light emitting layer not covered by the exfoliation layer, such that the light emitting unit 141 is obtained. That is, only the first organic light emitting layer in the predetermined area is remained, and the schematic structural diagram after peeling off is shown in FIG. 5.

Step S204, coating by evaporating a material to be peeled off on the base substrate corresponding to the first light emitting unit and the third predetermined area, to form the exfoliation layer.

Figure 6:
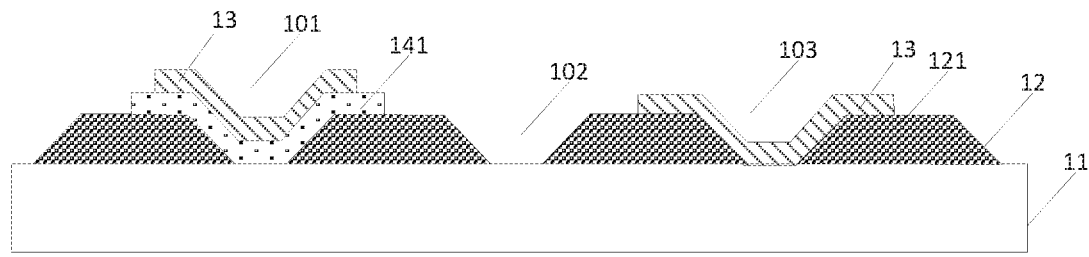
FIG. 6 is a schematic structural diagram of a fourth substep of the second step of the method of fabricating the organic light emitting diode display according to the present invention.

As shown in FIG. 6, the material to be peeled off is coated by evaporating on the base substrate corresponding to the first light emitting unit 141 and the third predetermined area 103 using the mask to form the layer 13 to be peeled. The material to be peeled off is a material with sublimation tendency. In an embodiment, the material to be peeled off includes sulfur. More particularly, the material to be peeled off is sulfur.

Step S205, using a second predetermined mask to form a second organic light emitting layer on the exfoliation layer and the base substrate corresponding to the second predetermined area.

Figure 7:
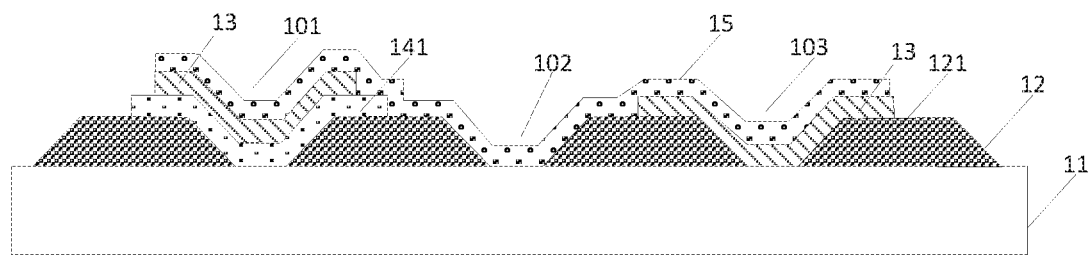
FIG. 7 is a schematic structural diagram of a fifth substep of the second step of the method of fabricating the organic light emitting diode display according to the present invention.

As shown in FIG. 7, a second organic light emitting material is coated by evaporating on the base substrate corresponding to the second predetermined area 102 and the exfoliation layer by using a second predetermined mask to form a second organic light emitting layer 15. The opening of the second predetermined mask is greater than a default value. For example, the second predetermined mask is a common mask of a large opening, which is distinguished over the FMM of the prior art. The second organic light emitting material is used to form the second light emitting unit.

Step S206. heating the base substrate to peel off the exfoliation layer and the second organic light emitting layer corresponding to the first predetermined area and the third predetermined area during heating, while remain the second organic light emitting layer of the second predetermined area, such that the second light emitting unit is obtained.

Figure 8:
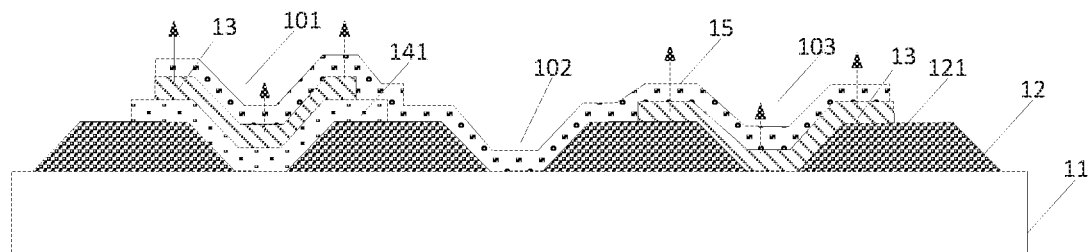
FIG. 8 is a schematic structural diagram of a sixth substep of the second step of the method of fabricating the organic light emitting diode display according to the present invention.
Figure 9:
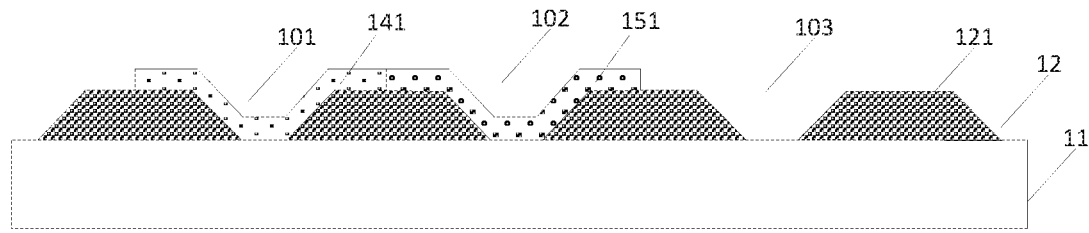
FIG. 9 is a schematic structural diagram after completing the sixth substep of the second step of the method of fabricating the organic light emitting diode display according to the present invention.

As shown in FIG. 8, the base substrate is heated to cause sublimation of the material to be peeled off, so as to peel off the layer 13 to be peeled off, thereby peeling off the second organic light emitting layer 15 attached to the layer 13 to be peeled off, while remain the organic light emitting layer 15 not covered by the layer 13 to be peeled off. Thus, the second light emitting unit 151 is obtained, and the schematic structural diagram after peeling off is shown in FIG. 9.

Step S207, coating by evaporating the material to be peeled off in the first light emitting unit and the second light emitting unit to form an exfoliation layer to be peeled off.

Figure 10:
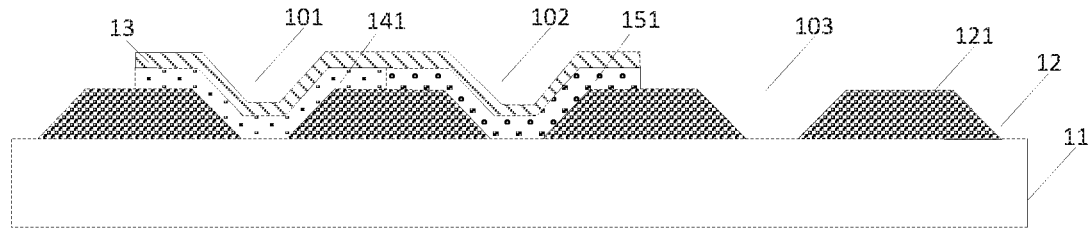
FIG. 10 is a schematic structural diagram of a seventh substep of the second step of the method of fabricating the organic light emitting diode display according to the present invention.

As shown in FIG. 10, the material to be peeled off is coated by evaporating on the first light emitting unit 141 and the second light emitting unit 151 using a mask to form a layer 13 to be peeled off.

S208, using a third predetermined mask to form a third organic light emitting layer on the exfoliation layer and the substrate corresponding to the third predetermined area.

Figure 11:
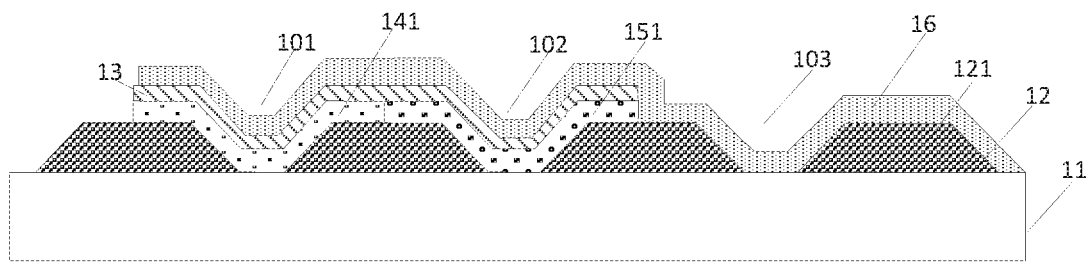
FIG. 11 is a schematic structural diagram of an eighth substep of the second step of the method of fabricating the organic light emitting diode display according to the present invention.

As shown in FIG. 11, a third organic light emitting material is coated by evaporating on the base substrate corresponding to the third predetermined area 103 and the exfoliation layer 13 to form a third organic light emitting layer 16 by using a third predetermined mask. The opening of the third predetermined mask is greater than a default value. For example, the third predetermined mask is a common mask of a large opening, which is distinguished over the FMM of the prior art. The third organic light emitting material is used to form the third light emitting unit.

As will be appreciated, the first predetermined mask, the second predetermined mask, and the third predetermined mask may be the same or different.

Step S209. heating the base substrate to peel off the layer to be peeled and the third organic light emitting layer corresponding to the first predetermined area and the second predetermined area, while remain the third organic light emitting layer of the third predetermined area, such that the third light emitting unit is obtained. The openings of the first predetermined mask, the second predetermined mask, and the third predetermined mask are greater than a default value.

Figure 12:
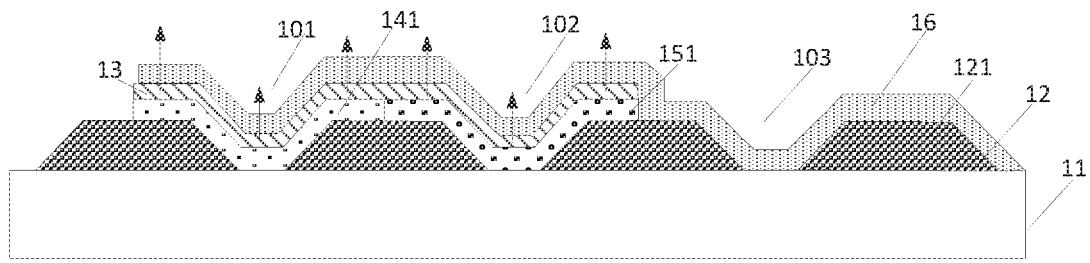
FIG. 12 is a schematic structural diagram of a ninth substep of the second step of the method of fabricating the organic light emitting diode display according to the present invention.
Figure 13:
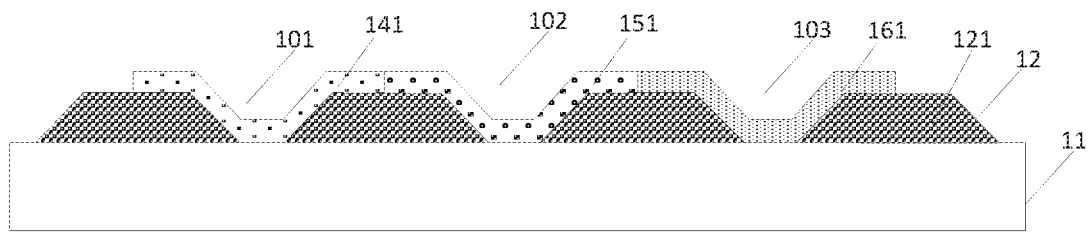
FIG. 13 is a schematic structural diagram after completing the ninth substep of the second step of the method of fabricating the organic light emitting diode display according to the present invention.

As shown in FIG. 12, the base substrate is heated to cause sublimation of the material to be peeled off, so as to peel off the layer 13 to be peeled off, thereby peeling off the third organic light emitting layer attached to the layer 13 to be peeled off, while remain the organic light emitting layer not covered by the layer 13 to be peeled off. Thus, the third light emitting unit 161 is obtained, and the schematic structural diagram after peeling off is shown in FIG. 13, thus completing the fabrication of the light emitting unit.

The method of the present invention further includes:

Step S103. forming a cathode on the light emitting unit.

The base substrate includes a substrate and an anode, and specifically, the cathode is formed on the first light emitting unit, the second light emitting unit, and the third light emitting unit.

Figure 14:
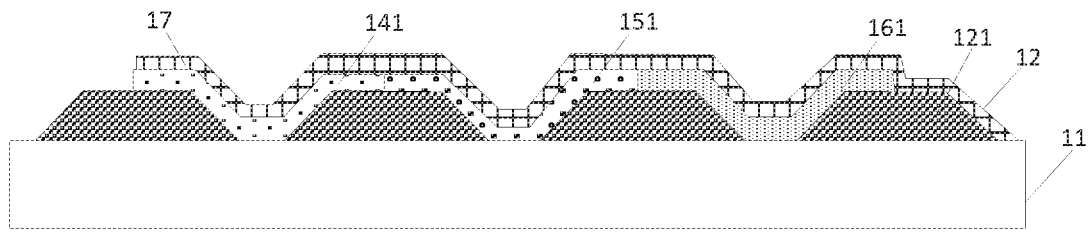
FIG. 14 is a schematic structural diagram of a third step of a method of fabricating an organic light emitting diode display according to the present invention.

As shown in FIG. 14, a cathode 17 is formed on the first light emitting unit 141, the second light emitting unit 151, and the third light emitting unit 161.

Since the organic light emitting material is evaporated by using a mask having a large opening when fabricating the first to third light emitting units, the opening of the mask is easy to accurately align with the pixel area, thereby preventing color mixing of the display and improving the resolution of the display. In addition, since the organic light emitting layer is formed by using a mask having a large opening, the use of the FMM can be reduced, thus reducing the production cost, while elevating the production efficiency.

In the method of fabricating the organic light emitting diode display according to the present invention, since the organic light emitting layer is evaporated using a mask having a large opening, inaccurate alignment of the opening of the mask with the pixel area can be prevented, thereby improving the resolution of the display.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A method of fabricating an organic light emitting diode display, comprising:
    forming a pixel definition layer on a base substrate, wherein the pixel definition layer includes a plurality of pixel definition units spaced apart from each other; and a first predetermined area, a second predetermined area, and a third predetermined area are provided among the pixel definition units; and
    forming a light emitting unit in the first predetermined area, the second predetermined area, and the third predetermined area, comprising:
        forming an exfoliation layer to be peeled off on the base substrate corresponding to two of the first predetermined area, the second predetermined area, and the third predetermined area, a material of the layer to be peeled including sulfur;
        using a predetermined mask to form an organic light emitting layer on the exfoliation layer and the base substrate which is not covered by the exfoliation layer; and
        heating the base substrate to cause sublimation of the material of the exfoliation layer, thereby peeling off the exfoliation layer and the organic light emitting layer attached to the exfoliation layer, while remaining the organic light emitting layer not covered by the exfoliation layer, such that the light emitting unit is obtained, wherein the predetermined mask has an opening greater than a default value.

2. The method of fabricating the organic light emitting diode display of claim 1, wherein the step of forming a exfoliation layer on the base substrate corresponding to two of the first predetermined area, the second predetermined area, and the third predetermined area comprises:
    coating by evaporating a material to be peeled off on the base substrate corresponding to two of the first predetermined area, the second predetermined area, and the third predetermined area to form the exfoliation layer.

3. The method of fabricating the organic light emitting diode display of claim 1, wherein the light emitting unit comprises a first light emitting unit, and the step of forming a light emitting unit in the first predetermined area, the second predetermined area, and the third predetermined area comprises:
    forming the exfoliation layer on the base substrate corresponding to the second predetermined area and the third predetermined area;
    using a first predetermined mask to form a first organic light emitting layer on the exfoliation layer and the base substrate corresponding to the first predetermined area, wherein the first predetermined mask has an opening greater than the default value;
    heating the base substrate to peel off the exfoliation layer and the first organic light emitting layer corresponding to the second predetermined area and the third predetermined area, while remain the first organic light emitting layer of the first predetermined area, such that the first light emitting unit is obtained.

4. The method of fabricating the organic light emitting diode display of claim 3, wherein the light emitting unit further comprises a second light emitting unit, and the step of forming the light unit in the first predetermined area, the second predetermined area, and the third predetermined area comprises:
    forming the exfoliation layer on the base substrate corresponding to the first light emitting unit and the third predetermined area;
    using a second predetermined mask to coat by evaporating a second organic light emitting material on the exfoliation layer and the base substrate corresponding to the second predetermined area to form a second organic light emitting layer, wherein the second predetermined mask has an opening greater than the default value; and
    heating the base substrate to peel off the exfoliation layer and the second organic light emitting layer corresponding to the first predetermined area and the third predetermined area during heating, while remain the second organic light emitting layer of the second predetermined area, such that the second light emitting unit is obtained.

5. The method of fabricating the organic light emitting diode display of claim 4, wherein the light emitting unit further comprises a third light emitting unit, and the step of forming the light emitting unit in the first predetermined area, the second predetermined area, and the third predetermined area comprises:
    forming the exfoliation layer at the first light emitting unit and the second light emitting unit;
    using a third predetermined mask to coat by evaporating a third organic light emitting material on the base substrate corresponding to the third predetermined area and the exfoliation layer to form a third organic light emitting layer, wherein the third predetermined mask has an opening greater than the default value; and
    heating the base substrate to peel off the layer to be peeled and the third organic light emitting layer corresponding to the first predetermined area and the second predetermined area, while remain the third organic light emitting layer of the third predetermined area, such that the third light emitting unit is obtained.

6. The method of fabricating the organic light emitting diode display of claim 5, wherein the first organic light emitting material is used to form the first light emitting unit; the second organic light emitting material is used to form the second light emitting unit; and the third organic light emitting material is used to form the third light emitting unit.

7. The method of fabricating the organic light emitting diode display of claim 3, wherein the step of using the first predetermined mask to form a first organic light emitting layer on the exfoliation layer and the base substrate corresponding to the first predetermined area comprises:
using the first predetermined mask to coat by evaporating a first organic light emitting material on the exfoliation layer and the base substrate corresponding to the first predetermined area to form the first organic light emitting layer.

8. The method of fabricating the organic light emitting diode display of claim 1, wherein the base substrate comprises a substrate and an anode, and the method further comprises: forming a cathode on the light emitting unit.

9. A method of fabricating an organic light emitting diode display, comprising:
forming a pixel definition layer on a base substrate, wherein the pixel definition layer includes a plurality of pixel definition units spaced apart from each other, and a first predetermined area, a second predetermined area, and a third predetermined area are provided among the pixel definition units; and
forming a light emitting unit in the first predetermined area, the second predetermined area, and the third predetermined area, comprising:
forming an exfoliation layer to be peeled off on the base substrate corresponding to two of the first predetermined area, the second predetermined area, and the third predetermined area;
using a predetermined mask to form an organic light emitting layer on the exfoliation layer and the base substrate which is not covered by the exfoliation layer; and
heating the base substrate to peel off the exfoliation layer and the organic light emitting layer covering the exfoliation layer, such that a light emitting unit is obtained, and the predetermined mask has an opening greater than the default value.

10. The method of fabricating the organic light emitting diode display of claim 9, wherein the step of heating the base substrate to peel off the exfoliation layer and the organic light emitting layer covering the exfoliation layer, while remain the organic light emitting layer not cover by the exfoliation layer, comprises:
heating the base substrate, to cause sublimation of the material of the exfoliation layer, so as to peel off the exfoliation layer, thereby peeling off the organic light emitting layer attached to the exfoliation layer, while remain the organic light emitting layer not covered by the exfoliation layer.

11. The method of fabricating the organic light emitting diode display of claim 9, wherein the step of forming a exfoliation layer on the base substrate corresponding to two of the first predetermined area, the second predetermined area, and the third predetermined area comprise:
a material to be peeled off on the base substrate corresponding to two of the first predetermined area, the second predetermined area, and the third predetermined area to form the exfoliation layer.

12. The method of fabricating the organic light emitting diode display of claim 9, wherein a material of the exfoliation layer comprises sulfur.

13. The method of fabricating the organic light emitting diode display of claim 9, wherein the light emitting unit comprises a first light emitting unit, and the step of forming a light emitting unit in the first predetermined area, the second predetermined area, and the third predetermined area comprises:
forming the exfoliation layer on the base substrate corresponding to the second predetermined area and the third predetermined area;
using a first predetermined mask to form a first organic light emitting layer on the exfoliation layer and the base substrate corresponding to the first predetermined area, wherein the first predetermined mask has an opening greater than the default value;
heating the base substrate to peel off the exfoliation layer and the first organic light emitting layer corresponding to the second predetermined area and the third predetermined area, while remain the first organic light emitting layer of the first predetermined area, such that the first light emitting unit is obtained.

14. The method of fabricating the organic light emitting diode display of claim 13, wherein the light emitting unit further comprises a second light emitting unit, and the step of forming the light unit in the first predetermined area, the second predetermined area, and the third predetermined area comprises:
forming the exfoliation layer on the base substrate corresponding to the first light emitting unit and the third predetermined area;
using a second predetermined mask to coat by evaporating a second organic light emitting material on the exfoliation layer and the base substrate corresponding to the second predetermined area to form a second organic light emitting layer, wherein the second predetermined mask has an opening greater than the default value; and
heating the base substrate to peel off the exfoliation layer and the second organic light emitting layer corresponding to the first predetermined area and the third predetermined area during heating, while remain the second organic light emitting layer of the second predetermined area, such that the second light emitting unit is obtained.

15. The method of fabricating the organic light emitting diode display of claim 14, wherein the light emitting unit further comprises a third light emitting unit, and the step of forming the light emitting unit in the first predetermined area, the second predetermined area, and the third predetermined area comprises:
forming the exfoliation layer at the first light emitting unit and the second light emitting unit;
using a third predetermined mask to coat by evaporating a third organic light emitting material on the base substrate corresponding to the third predetermined area and the exfoliation layer to form a third organic light emitting layer, wherein the third predetermined mask has an opening greater than the default value; and
heating the base substrate to peel off the exfoliation layer and the third organic light emitting layer corresponding to the first predetermined area and the second predetermined area, while remain the third organic light emitting layer of the third predetermined area, such that the third light emitting unit is obtained.

16. The method of fabricating the organic light emitting diode display of claim 15, wherein the first organic light emitting material is used to form the first light emitting unit; the second organic light emitting material is used to form the second light emitting unit; and the third organic light emitting material is used to form the third light emitting unit.

17. The method of fabricating the organic light emitting diode display of claim 13, wherein the step of using the first predetermined mask to form a first organic light emitting layer on the exfoliation layer and the base substrate corresponding to the first predetermined area comprise:
 using the first predetermined mask to coat by evaporating a first organic light emitting material on the exfoliation layer and the base substrate corresponding to the first predetermined area to form the first organic light emitting layer.

18. The method of fabricating the organic light emitting diode display of claim 9, wherein the base substrate comprises a substrate and an anode, and the method further comprises: forming a cathode on the light emitting unit.

\* \* \* \* \*